(12) United States Patent
Nagao et al.

(10) Patent No.: US 11,722,224 B2
(45) Date of Patent: Aug. 8, 2023

(54) OPTICAL SEMICONDUCTOR DEVICE

(71) Applicant: Mitsubishi Electric Corporation, Tokyo (JP)

(72) Inventors: Ryosuke Nagao, Tokyo (JP); Yuichiro Okunuki, Tokyo (JP); Keisuke Matsumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/428,624

(22) PCT Filed: May 27, 2019

(86) PCT No.: PCT/JP2019/020829
§ 371 (c)(1),
(2) Date: Aug. 4, 2021

(87) PCT Pub. No.: WO2020/240645
PCT Pub. Date: Dec. 3, 2020

(65) Prior Publication Data
US 2022/0116117 A1 Apr. 14, 2022

(51) Int. Cl.
*H04B 10/50* (2013.01)
*H04B 10/61* (2013.01)
(Continued)

(52) U.S. Cl.
CPC .......... *H04B 10/614* (2013.01); *G02B 6/425* (2013.01); *G02B 6/4295* (2013.01); *H01S 5/026* (2013.01);
(Continued)

(58) Field of Classification Search
CPC ..... H01S 5/026; H04B 10/614; H04B 10/503; H04B 10/802; H04B 10/506; H04B 10/50;
(Continued)

(56) References Cited

U.S. PATENT DOCUMENTS

| | | | |
|---|---|---|---|
| 8,102,886 B1* | 1/2012 | Ho | H01S 5/026 372/20 |
| 2006/0118893 A1* | 6/2006 | Behfar | H01S 5/0262 257/E31.022 |

(Continued)

FOREIGN PATENT DOCUMENTS

| | | |
|---|---|---|
| JP | 2013-089961 A | 5/2013 |
| JP | 2016-149529 A | 8/2016 |
| JP | 2016-162798 A | 9/2016 |

OTHER PUBLICATIONS

International Search Report issued in PCT/JP2019/020829; dated Aug. 13, 2019.

*Primary Examiner* — Hibret A Woldekidan
(74) *Attorney, Agent, or Firm* — Studebaker & Brackett PC

(57) ABSTRACT

An optical device includes: lasers output first light from a front-end side and output second light from a rear-end side; an optical multiplexer circuit multiplex respective rays of the first light, to thereby send out output light; waveguides guide respective rays of the second light toward one end face of the optical device; and light detectors receive respective rays of reflected light that are due to reflection of the respective rays of the second light after being guided by the waveguides, on the one end face or on respective inclined end faces in concave portions formed on that one end face. The light detector is located between the rear-end side of the laser and the one end face or the inclined end face, and the second light is outputted diagonally relative to a perpendicular line with respect to the one end face or the inclined end face.

21 Claims, 7 Drawing Sheets

(51) Int. Cl.
*G02B 6/42* (2006.01)
*H01S 5/026* (2006.01)
*H04B 10/80* (2013.01)
*H04J 14/02* (2006.01)

(52) U.S. Cl.
CPC ......... *H04B 10/503* (2013.01); *H04B 10/802* (2013.01); *H04J 14/02* (2013.01)

(58) Field of Classification Search
CPC .... H04B 10/501; H04B 10/502; G02B 6/425; G02B 6/4295; G02B 2006/12104; G02B 2006/12107; G02B 2006/12121; G02B 2006/12114; G02B 2006/12111; G02B 2006/12109; G02B 2006/12119; H04J 14/02; G01J 1/0425; G01J 1/0411
USPC ....... 398/140, 141, 182, 200, 168, 169, 170, 398/43
See application file for complete search history.

(56) References Cited

U.S. PATENT DOCUMENTS

| | | |
|---|---|---|
| 2013/0094527 A1 | 4/2013 | Fukuda et al. |
| 2013/0148676 A1 | 6/2013 | Fukuda et al. |
| 2013/0235891 A1 | 9/2013 | Fukuda et al. |
| 2016/0233642 A1 | 8/2016 | Takabayashi et al. |

* cited by examiner

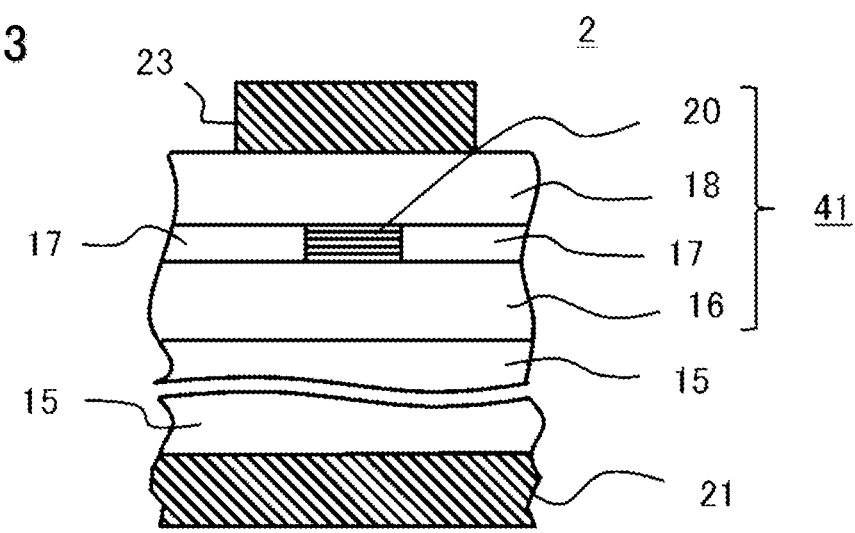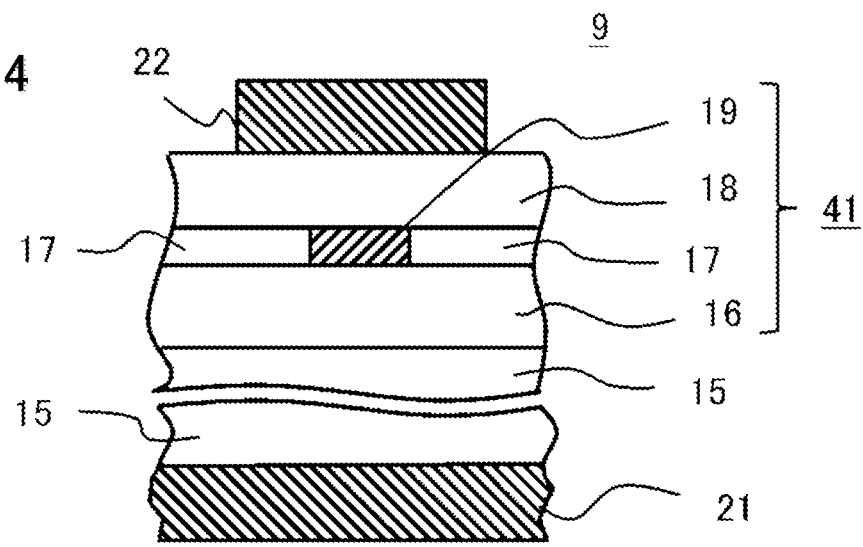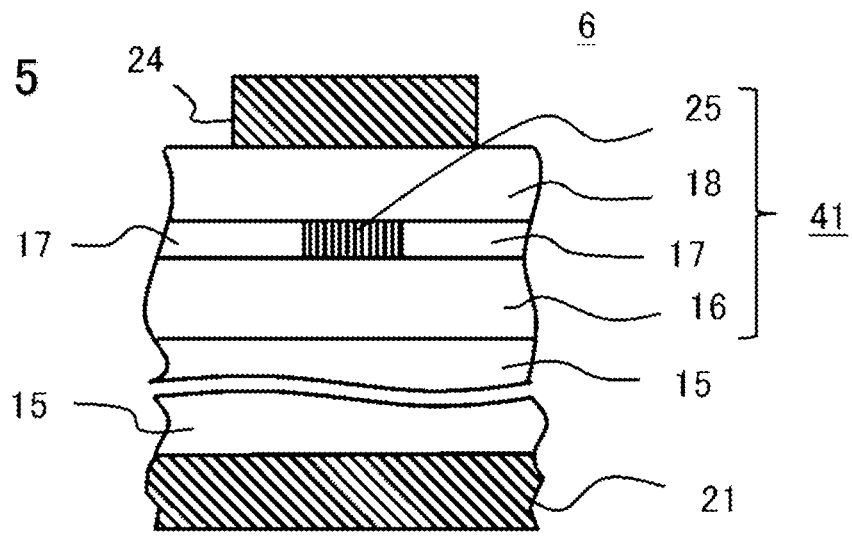

OPTICAL SEMICONDUCTOR DEVICE

TECHNICAL FIELD

The present application relates to an optical semiconductor device.

BACKGROUND ART

In recent years, in the field of optical communications, optical transmission systems are becoming faster in operation and larger in capacity, and as a core technology for them, a Wavelength Division Multiplexing (WDM) method has been widespread in which plural optical signals with different wavelengths are transmitted in a multiplexed manner by using a single optical fiber. Further, in addition to the WDM method, as another core technology that is essential for the optical transmission system to be faster in operation and larger in capacity, a digital coherent method has been rapidly spread in which optical phase information is employed for modulation.

In FIG. 26 of Patent Document 1, a wavelength-variable light source is described which is an optical semiconductor device to be used in a digital coherent transceiver. In the wavelength-variable light source in FIG. 26 of Patent Document 1, a semiconductor laser array, a multiplexer for multiplexing output light of the semiconductor lasers and an optical amplifier for amplifying output light from the multiplexer, are integrated monolithically. The wavelength-variable light source is configured: to output, through the amplifier and from a front-end face of the light source, output light (forward output light) having been outputted from front-end faces at respective one ends of the semiconductor lasers, for communication use; and to output, from a rear-end face thereof, output light (rearward output light) having been outputted from rear-end faces at the other ends of the semiconductor lasers, so as to allow that light to be monitored.

CITATION LIST

Patent Document

Patent Document 1: Japanese Patent Application Laid-open No. 2016-149529 (FIG. 26)

SUMMARY OF INVENTION

Problems to be Solved by Invention

According to the digital coherent method, because the optical phase information is used, a phase noise of the light source is an issue. As an index indicative of the phase noise of the light source, a spectral linewidth is used, so that it is important to achieve narrowing of the spectral linewidth.

The wavelength-variable light source in FIG. 26 of Patent Document 1 is so configured that the rearward output light having been outputted from each of the semiconductor lasers in the semiconductor laser array is outputted perpendicularly relative to the rear-end face, and a wavelength monitor is connected to the wavelength-variable light source on the outside thereof. Thus, there is a problem that the rearward output light may be reflected off from the rear-end face toward the semiconductor laser, thus causing increase in the spectral linewidth of the forward output light to be used for optical communication.

An object of a technique disclosed in this description is to achieve an optical semiconductor device which can reduce return light that is due to reflection on a rear-side end face thereof, of the output light outputted from each of the semiconductor lasers in the semiconductor array, and that is directed to the semiconductor laser, to thereby suppress increase in the spectral linewidth of the output light for optical communication.

Means for Solving Problems

An optical semiconductor device disclosed as an example in this description, is an optical semi-conductor device which comprises plural semiconductor lasers, plural light detectors, plural waveguides and an optical multiplexer circuit that are formed on a semiconductor substrate, said plural semiconductor lasers each serving to output first light from a front-end side thereof and also to output second light from a rear-end side thereof that is a side opposite to the front-end side;

said optical multiplexer circuit serving to multiplex respective rays of the first light outputted from the plural semiconductor lasers, to thereby send out output light;

said plural waveguides serving to guide respective rays of the second light toward one end face of the optical semi-conductor device; and said plural light detectors serving to receive respective rays of reflected light that are due to reflection of the respective rays of the second light after being guided by the waveguides, on the one end face or on respective inclined end faces in plural concave portions formed on the one end face.

The light detectors are each located between the rear-end side of each of the semiconductor lasers and the one end face or each of the inclined end faces, and the second light to be outputted from each of the waveguides is outputted diagonally relative to a perpendicular line with respect to the one end face or the inclined end face.

Effect of Invention

In the optical semiconductor device disclosed as an example in the present description, for each of the semiconductor lasers, the light detector is provided that receives the reflected light due to reflection of the second light outputted from the rear-end side of each of the semiconductor lasers, on the one end face or on the inclined end face in the concave portion formed on the one end face. Thus, it is possible to reduce return light toward the semiconductor laser, that is due to reflection on the rear-side end face, to thereby suppress increase in the spectral linewidth of the output light for optical communication.

BRIEF DESCRIPTION OF DRAWINGS

FIG. 3 is a sectional view along A-A in FIG. 1.

FIG. 4 is a sectional view along B-B in FIG. 1.

FIG. 5 is a sectional view along C-C in FIG. 1.

MODES FOR CARRYING OUT INVENTION

Embodiment 1

Figure 1:
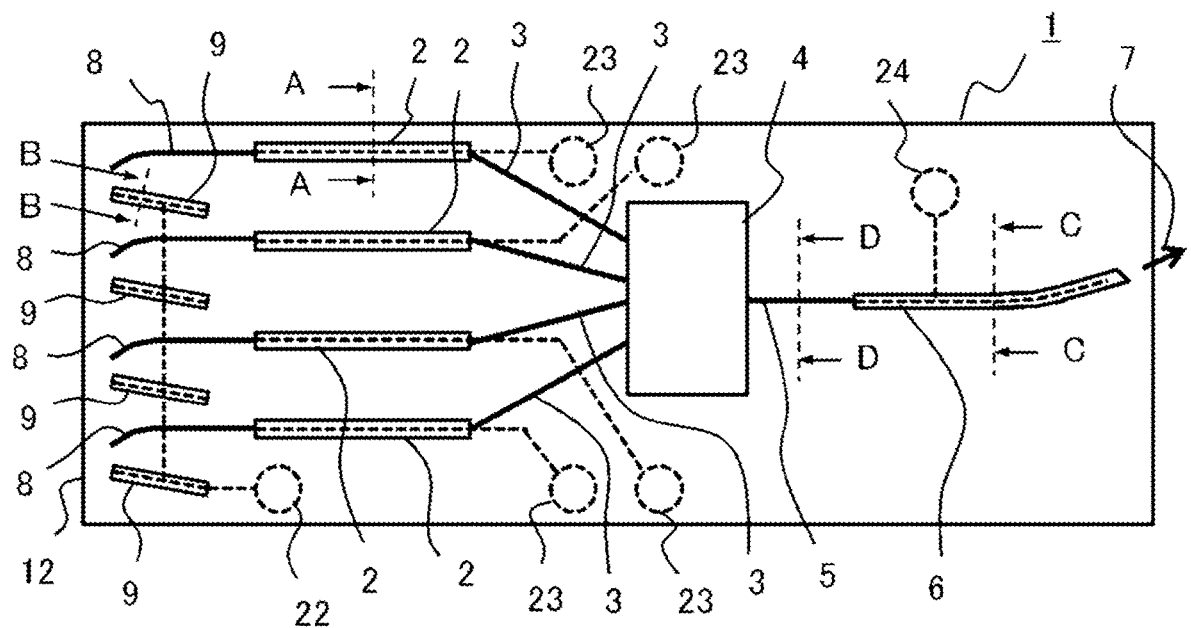
FIG. 1 is a diagram showing an optical semiconductor device according to Embodiment 1.
Figure 2:
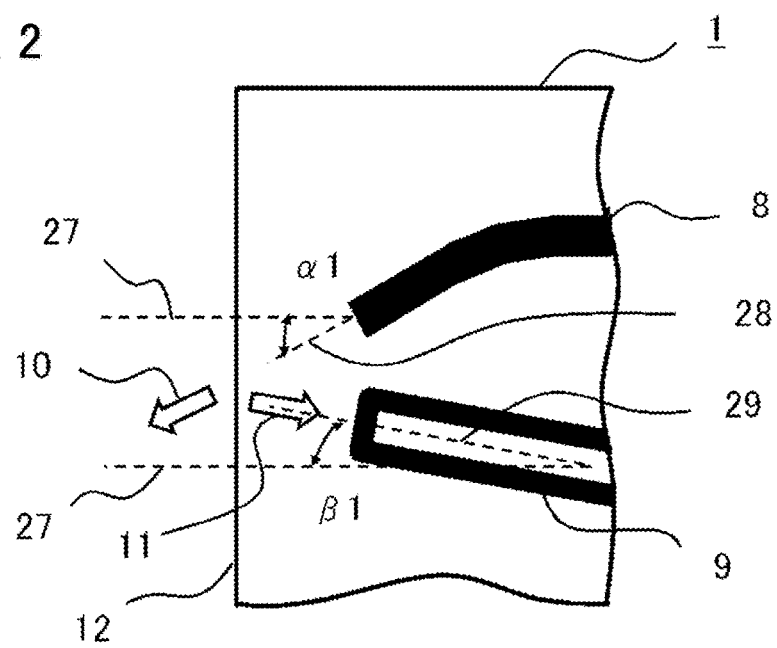
FIG. 2 is an enlarged view of rear-end face side portions of a first example of a third waveguide and a light detector in FIG. 1.
Figure 6:
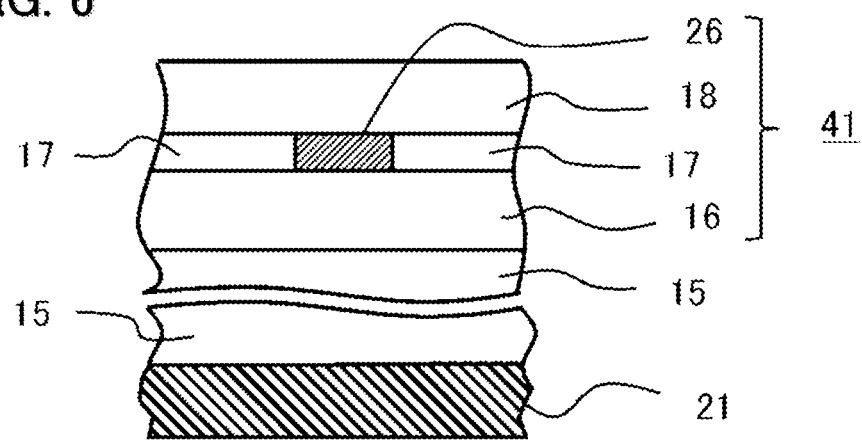
FIG. 6 is a sectional view along D-D in FIG. 1.
Figure 7:
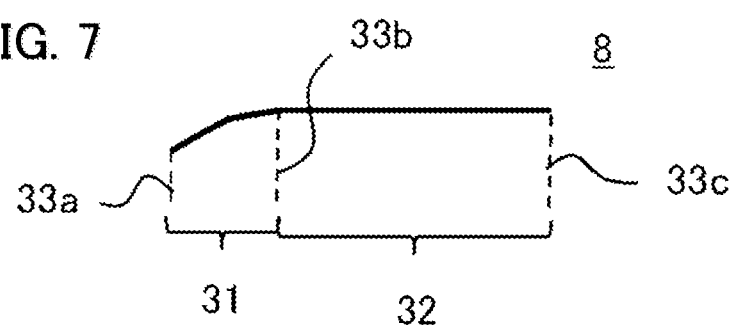
FIG. 7 is a diagram showing the first example of the third waveguide in FIG. 1.
Figure 8:
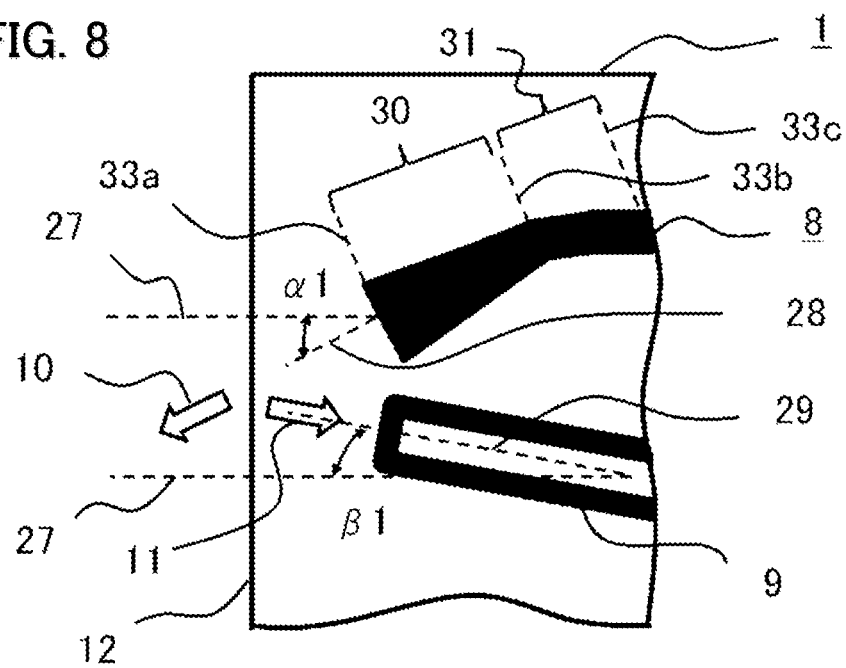
FIG. 8 is a diagram showing a second example of the third waveguide in FIG. 1.

An optical semiconductor device 1 of Embodiment 1 will be described with reference to the drawings. For the same or equivalent configuration elements herein, the same reference numerals will be given, so that repetitive description thereof will be omitted as the case may be. FIG. 1 is a diagram showing the optical semiconductor device according to Embodiment 1, and FIG. 2 is an enlarged view of rear-end face side portions of a first example of a third waveguide and a light detector in FIG. 1. FIG. 3 is a sectional view along A-A in FIG. 1, and FIG. 4 is a sectional view along B-B in FIG. 1. FIG. 5 is a sectional view along C-C in FIG. 1, and FIG. 6 is a sectional view along D-D in FIG. 1. FIG. 7 is a diagram showing the first example of the third waveguide in FIG. 1, and FIG. 8 is a diagram showing a second example of the third waveguide in FIG. 1. The optical semiconductor device 1 of Embodiment 1 represents an exemplary narrow-linewidth light source in which light detectors are integrated and whose spectral linewidth is narrower than before. The optical semiconductor device 1 of Embodiment 1 includes: plural semiconductor lasers 2; an optical multiplexer circuit 4; an optical amplifier 6; plural first waveguides 3 that connect the respective semiconductor lasers 2 and the optical multiplexer circuit 4 to each other; a second waveguide 5 that connects the optical multiplexer circuit 4 and the optical amplifier 6 to each other; plural third waveguides 8 extending from the respective semiconductor lasers 2 toward a rear-end face 12; and plural light detectors 9 each serving to receive reflected light 11 of second output light 10 outputted from each of the third waveguides 8. The plural semiconductor lasers 2, the plural first waveguides 3, the plural third waveguides 8 and the plural light detectors 9 constitute a semiconductor laser array, a first waveguide array, a third waveguide array and a light detector array, respectively. The respective numbers of the semiconductor lasers 2, the first waveguides 3, the third waveguides 8 and the light detectors 9 are the same. In FIG. 1, a case is shown where the light detectors 9 each extend in a manner inclined relative to the extending direction of each of the semiconductor lasers 2.

In FIG. 1, the optical semiconductor device 1 is exemplified as including four semiconductor lasers 2; however, actually, any plural number of semiconductor lasers 2 may be included, and the number may be 16, for example. The semiconductor laser 2 is, for example, a DFB-LD (Distributed feedback-laser diode). The respective semiconductor lasers 2 are connected at their one ends to the first waveguides 3 and connected at their other ends to the third waveguides 8, and are capable of emitting respective rays of single-mode light having different wavelengths. Note that, when another semiconductor laser 2 as a spare is mounted in the optical semiconductor device 1, one of the semiconductor lasers 2 may emit light having a wavelength that is the same as a wavelength of another one. The optical multiplexer circuit 4 is a multi-input and single-output type optical multiplexer. When the number of the semiconductor lasers 2 is 16, the optical multiplexer circuit 4 is a 16×1-MMI (Multi-Mode Interference) circuit. To the input side of the optical multiplexer circuit 4, the plural first waveguides 3 are connected, and to the output side thereof, the second waveguide 5 is connected, so that the optical multiplexer circuit multiplexes the rays of first output light of corresponding semiconductor lasers 2 that have been inputted from their respective first waveguides 3, and outputs the thus-multiplexed first output light to the second waveguide 5. The optical amplifier 6 is connected to the second waveguide 5, and thus amplifies the above first output light and then outputs it as first output light 7 to the outside of the optical semiconductor device 1.

The first waveguides 3 each cause the first output light outputted from the semiconductor laser 2, to be guided (to propagate) to the optical multiplexer circuit 4. The third waveguides 8 each cause the second output light outputted from the semiconductor laser 2 to the rear-end face 12-side, to be guided toward the rear-end face 12. The light detectors 9 each absorb the reflected light 11 due to reflection on the rear-end face 12, of the light after being outputted from the third waveguide 8 toward the rear-end face 12, to thereby output a detection current. According to the optical semiconductor device 1 of Embodiment 1, the first output light 7 that is the rays of the first output light outputted by the semiconductor lasers 2, is used for optical communication, while the reflected light 11 that is a part of the second output light outputted by the semiconductor laser 2, is used for monitoring. The detection current due to monitoring of the reflected light 11 by the light detector 9 and outputted therefrom, is used for wavelength adjustment or the like, of the semiconductor laser 2. The rear-end face 12 of the optical semiconductor device 1, and a front-end face thereof which is an end face opposite to the rear-end face 12 and where the first output light 7 is outputted, are formed by cleavage.

Description will be made about the vertical structures of the semiconductor laser 2, the light detector 9, the optical amplifier 6, the first waveguide 3, the second waveguide 5 and the third waveguide 8. Since the vertical structures of the first waveguide 3, the second waveguide 5 and the third waveguide 8 are the same, the second waveguide 5 will be described as a representative thereof. The semiconductor laser 2 is provided with: an InP semiconductor substrate 15; an epi structure 41 formed on a front surface of the InP semiconductor substrate 15; an anode electrode 23 formed on a front-surface side of the epi structure 41; and a cathode electrode 21 formed on a back surface of the semiconductor substrate 15. The epi structure 41 is provided with: an InP first cladding layer 16; InP current blocking layers 17 & an active layer 20; and an InP second cladding layer 18; that are sequentially formed on a front surface of the semiconductor substrate 15. Note that, in FIG. 3, a diffraction grating formed on the front or back surface of the active layer 20, and a contact layer formed on a front surface of the second cladding layer 18, namely, a front surface of the epi structure 41, are omitted from illustration. The active layer 20 is made of InGaAsP or InGaAlAs. When a forward bias is applied to the semiconductor laser 2, a current is injected therein through the anode electrode 23, so that the active layer 20 gets a gain to thereby generate spontaneous emission light. Because of the unshown diffraction grating, a specific-wavelength portion of the spontaneous emission light serves as seed light for inductive emission, and a laser is emitted when such emission exceeds a predetermined threshold current. The cathode electrode 21 is a cathode electrode that is common to the semiconductor lasers 2, the optical amplifier 6 and the light detectors 9, and is formed, for example, entirely on the back surface of the semiconductor substrate 15.

The light detector 9 is provided with: the InP semiconductor substrate 15; an epi structure 41 formed on a front surface of the InP semiconductor substrate 15; an anode electrode 22 formed on a front-surface side of the epi structure 41; and the cathode electrode 21 formed on a back surface of the semiconductor substrate 15. The epi structure 41 of the light detector 9 differs from the epi structure 41 of the semiconductor laser 2 in that InP current blocking layers 17 and a light absorption layer 19 are formed on front surfaces of the first cladding layer 16. Note that, in FIG. 4, a contact layer formed on a front surface of the second cladding layer 18, namely, a front surface of the epi structure 41, is omitted from illustration. The light absorption layer 19 is made of InGaAsP or InGaAlAs capable of absorbing the reflected light 11. The light detector 9, when no forward bias is applied thereto, absorbs the reflected light 11 in the light absorption layer 19. Further, the light detector 9, when a reverse bias is applied thereto, absorbs the reflected light 11 in the light absorption layer 19 and outputs the detection current.

The optical amplifier 6 is provided with: the InP semiconductor substrate 15; an epi structure 41 formed on a front surface of the InP semiconductor substrate 15; an anode electrode 24 formed on a front-surface side of the epi structure 41; and the cathode electrode 21 formed on a back surface of the semiconductor substrate 15. The epi structure 41 of the optical amplifier 6 differs from the epi structure 41 of the semiconductor laser 2 in that InP current blocking layers 17 and an active layer 25 are formed on front surfaces of the first cladding layer 16. Note that, in FIG. 5, a contact layer formed on a front surface of the second cladding layer 18 is omitted from illustration. The active layer 25 is made of InGaAsP or InGaAlAs having a gain with respect to the guided light having been guided by the second waveguide 5. Note that, although the optical amplifier 6 has a function of amplifying, when a forward bias is applied thereto, the output light outputted from the semi-conductor lasers 2, it is designed not to cause laser emission by itself. Further, when no forward bias is applied to the optical amplifier 6, the active layer 25 acts as a light absorption layer, so that the optical amplifier can be employed as a shutter, at the time of the wavelength change.

The second waveguide 5 is provided with: the InP semiconductor substrate 15; an epi structure 41 formed on a front surface of the InP semiconductor substrate 15; and the cathode electrode 21 formed on a back surface of the semiconductor substrate 15. Note that, even though the cathode electrode 21 is not functionally required for the second waveguide 5, the cathode electrode 21 is formed on the back surface of the semiconductor substrate 15 being located below a light confinement layer 26 of the second waveguide 5. The epi structure 41 of the second waveguide 5 differs from the epi structure 41 of the semiconductor laser 2 in that InP current blocking layers 17 and the light confinement layer 26 are formed on front surfaces of the first cladding layer 16. The light confinement layer 26 is made of InGaAsP. Note that, as described previously, the vertical structures of the first waveguide 3, the second waveguide 5 and the third waveguide 8 are the same, and thus the vertical structures of the first waveguide 3 and the third waveguide 8 are the same as that of FIG. 6.

The active layer 20 of the semiconductor laser 2, the light absorption layer 19 of the light detector 9, the active layer 25 of the optical amplifier 6, and the light confinement layers 26 of the first waveguide 3, the second waveguide 5 and the third waveguide 8, are each an epitaxial layer formed using an MOCVD (Metal Organic Chemical Vapor Deposition) apparatus, an MBE (Molecular Beam Epitaxy) apparatus or the like. The active layer 20, the light absorption layer 19, the active layer 25 and the light confinement layers 26 are each formed on a front surface of the first cladding layer 16, and thus they are individually formed using a photolithographic technique and an etching technique. Note that, in the case where the active layer 20, the light absorption layer 19, the active layer 25 and the light confinement layers 26 are formed of the same material, the respective active layers 20, light absorption layers 19, active layer 25 and light confinement layers 26 can be formed in such a manner that an epitaxial layer is formed on the front surface of the first cladding layer 16 and is then subjected to etching.

As shown in FIG. 1, the anode electrode 23 of the semiconductor laser 2 extends in the longitudinal direction of the semiconductor laser 2, and its external connection portion that is a portion to be connected to an outside (a portion in each of broken-line circles) is located, for example, on one end side or the other end side of the optical semiconductor device 1 in the transverse direction. As shown in FIG. 1, the anode electrode 24 of the optical amplifier 6 extends along the extending direction of the optical amplifier 6, and its external connection portion that is a portion to be connected to an outside (a portion in a broken-line circle) is located, for example, on the one end side of the optical semiconductor device 1 in the transverse direction. As shown in FIG. 1, the anode electrode 22 of the light detector 9 extends in the longitudinal direction of the light detector 9 and the anode electrodes 22 of the plural light detectors 9 are connected to each other. An external connection portion for the anode electrodes 22 of the light detectors 9, that is a portion to be connected to an outside (a portion in a broken-line circle) is located, for example, on the other end side of the optical semiconductor device 1 in the transverse direction. In FIG. 1, a case is shown where a set of the anode electrodes 22 is located to intersect with the light confinement layers 26 of the top 2nd to 4th third waveguides 8. Note that the one end side and the other end side of the optical semiconductor device 1 in the transverse direction correspond to the upper side and the lower side in FIG. 1, respectively. In FIG. 1, a case is shown where the extending direction of the semiconductor laser 2 corresponds to the longitudinal direction of the optical semiconductor device 1, and the extending direction of the light detector 9 is inclined relative to the extending direction of the semiconductor laser 2. Further, in FIG. 1, a case is shown where a portion of the optical amplifier 6 on the upstream side in the traveling direction of light, extends in the longitudinal direction of the optical semiconductor device 1, whereas a portion thereof on the downstream side is inclined relative to the longitudinal direction of the optical semiconductor device 1, so that the first output light 7 is outputted diagonally relative to a perpendicular line (not shown) with respect to a front-end face of the optical semiconductor device 1 that is an end face opposite to the rear-end face 12.

The third waveguide 8 includes, for example, a curved portion 31 and a linear portion 32. A portion from a broken line 33a to a broken line 33b in FIG. 7 is the curved portion 31, and a portion from the broken line 33b to a broken line 33c in FIG. 7 is the linear portion 32. As shown in FIG. 2, the second output light 10 to be outputted from the third waveguide 8 is outputted diagonally relative to a perpendicular line 27 with respect to the rear-end face 12 of the optical semiconductor device 1. Thus, out of the reflected light 11 due to reflection on the rear-end face 12, light that is incident on the third waveguide 8 and guided toward the semiconductor laser 2, namely, return light, is reduced. It is preferable that the second output light 10 of the third waveguide 8 be outputted at an angle of 7° or more relative to the perpendicular line 27 with respect to the rear-end face 12. Namely, it is preferable that an angle $\alpha 1$ between a broken line 28 that is parallel to the traveling direction of the second output light 10 and the perpendicular line 27 be 7° or more. Meanwhile, the light detector 9 is located to extend in a traveling direction of the reflected light 11 due to reflection on the rear-end face 12. Namely, the light detector 9 is located to extend on a broken line 29 indicative of the traveling direction of the reflected light 11. As an angle $\beta 1$ between the broken line 29 and the perpendicular line 27, an optimal angle is selected according to the angle $\alpha 1$. At the angle $\beta 1$, the light detector 9 is located to extend on the broken line 29 indicative of the traveling direction of the reflected light 11, so that it can absorb the reflected light 11 most efficiently. However, with respect to the angle $\beta 1$, the light detector may be deviated from the broken line 29 indicative of the traveling direction of the reflected light 11. When the angle $\beta 1$ is set smaller than the angle $\alpha 1$, it is possible to decrease the width of the optical semiconductor device 1 in the transverse direction, namely, the width in the array direction of the semiconductor lasers 2 and the light detectors 9. Note that, when the spread of the second output light 10 is small, the output angle $\alpha 1$ at which the light is outputted toward the rear-end face 12, is the same as the reflection angle of the reflected light 11 (the angle between the traveling direction at which the intensity is maximum, and the perpendicular line 27). In FIG. 2, a case is shown where, in terms of decreasing the width of the optical semiconductor device 1 in the transverse direction, the arrangement angle $\beta 1$ of the light detector 9 is set smaller than the output angle $\alpha 1$.

According to the optical semiconductor device 1 of Embodiment 1, when the second output light 10 is outputted from the third waveguide 8 at an angle of 7° or more relative to the perpendicular line 27 with respect to the rear-end face 12, it is possible to reduce return light from the reflected light 11 due to reflection on the rear-end face 12, that is incident on the third waveguide 8 and guided toward the semi-conductor laser 2. According to the optical semi-conductor device 1 of Embodiment 1, because the return light from the reflected light 11 due to reflection on the rear-end face 12, that goes back to the semiconductor laser 2 from the third waveguide 8, can be reduced, it is possible to suppress increase in the spectral linewidth of the first output light 7 to be used for optical communication. Note that it is also possible to suppress increase in the spectral linewidth of the second output light 10 to be outputted on the rear-end face 12-side.

It is preferable that the waveguide width at the output end of the third waveguide 8, namely, its waveguide width on the rear-end face 12-side, be 3 μm or more. It is more preferable that the waveguide width at the output end of the third waveguide 8 be 4 μm or more. This suppresses spreading of the beam of the second output light 10 to be outputted from the third waveguide 8, to thereby reduce the return light toward the semiconductor laser 2. Further, in terms of variation in isolation accuracy of the optical semi-conductor device 1 as a chip, it is preferable that the interval between the output end of the third waveguide 8 and the rear-end face 12 be from 10 to 30 μm. Namely, a gap between the adjacent chips is designed in a condition that an interval of at least 10 μm is ensured between the output end of the third waveguide 8 and the rear-end face 12.

As shown in FIG. 8, the third waveguide 8 may be a tapered and curved waveguide that includes a tapered portion 30 and a curved portion 31. A portion from a broken line 33a to a broken line 33b in FIG. 8 is the tapered portion 30, and a portion from the broken line 33b to a broken line 33c in FIG. 8 is the curved portion 31. In the end region on a side where the second light (the second light 10) is outputted, the tapered portion 30 has a shape that becomes wider in the traveling direction of the light. Further, the third waveguide 8 may be a waveguide that includes the tapered portion 30, the curved portion 31 and the linear portion 32 in combination, or a waveguide that solely includes one of these portions. Namely, the third waveguide 8 may be configured as a tapered linear waveguide (see, FIG. 13), a linear waveguide (see, FIG. 12), a tapered and curved waveguide (see, FIG. 8) or a curved waveguide (see, FIG. 15), or any combination thereof. According to the optical semiconductor device 1 of Embodiment 1, when the third waveguide 8 is given as a tapered and curved waveguide or a curved waveguide, it is possible to enhance flexibility about an output angle of the second output light 10 toward the rear-end face 12. In terms of reducing radiation light and ensuring single mode waveguiding, it is preferable that the curvature radius of the third waveguide 8 as a tapered and curved waveguide or a curved waveguide, be 300 μm or more. It is more preferable that the curvature radius of the third waveguide 8 as a tapered and curved waveguide or a curved waveguide, be 1000 μm or more.

The light detector 9 is not located on the axis of the semiconductor laser 2 in the extending direction, but is formed on a light path of the reflected light 11 produced at the rear-end face 12 from the second output light 10 outputted from the third waveguide 8. Accordingly, the optical semiconductor device 1 of Embodiment 1 can ensure isolation between the anode electrode 23 of the semiconductor laser 2 and the anode electrode 22 of the light detector 9, and at the same time, can suppress increase in the chip length of the optical semiconductor device 1 in the longitudinal direction. Further, according to the optical semiconductor device 1 of Embodiment 1, because almost all of the reflected light 11 produced at the rear-end face 12 from the second output light 10 outputted from the third waveguide 8 is absorbed by the light detector 9, it is possible to suppress the reflected light 11 from being reflected again in the optical semiconductor device 1, so that return light toward the semiconductor laser 2 can be reduced. Further, in terms of variation in isolation accuracy of the optical semiconductor device 1 as a chip, it is preferable that the interval between a reflected-light incident end of the light detector 9, namely, an incident end thereof near the rear-end face 12, and the rear-end face 12, be from 10 to 30 μm. Namely, a gap between the adjacent chips is designed in a condition that an interval of at least 10 μm is ensured between the reflected-light incident end of the light detector 9, namely, the incident end near the rear-end face 12, and the rear-end face 12.

The optical semiconductor device 1 of Embodiment 1 does not employ the second output light 10 outputted from the rear-end face 12 to the outside. Thus, according to the optical semiconductor device 1 of Embodiment 1, no restriction is imposed on the output angle from the end face of the third waveguide 8, that is, the angle $\alpha 1$, so that flexibility on how to select and locate the third waveguide 8 and how to locate the light detector 9 is enhanced. Further, according to the optical semiconductor device 1 of Embodiment 1, the anode electrodes 22 of the plural light detectors 9 can be made common with each other, so that only one external connection portion may be used for connecting the anode electrodes 22 of the light detectors 9 to the outside. Therefore, according to the optical semiconductor device 1 of Embodiment 1, by making the anode electrodes 22 of the plural light detectors 9 common with each other, it is possible to decrease the number of external connection portions, to thereby reduce the chip size.

The optical semiconductor device 1 of Embodiment 1 can reduce return light toward the semi-conductor laser 2 that is caused by the reflected light 11 produced at the rear-end face 12 from the second output light 10 outputted from the third waveguide 8, to thereby suppress increase in the spectral linewidth of the first output light 7. This makes it possible to narrow the spectral linewidth of the first output light 7. Because of being capable of narrowing the spectral linewidth of the first output light 7, the optical semiconductor device 1 of Embodiment 1 can achieve a narrow-linewidth light source. Accordingly, with the use of the optical semiconductor device 1 of Embodiment 1, it is possible to establish digital coherent optical communication, highly accurately.

In general, in order to perform stable optical communication by using a WDM method, it is necessary to secure a spare light source in case of unexpected shut-down of a signal light source. However, in the case where one semiconductor laser is mounted per one optical semiconductor device, if a spare light source is secured for each of the wavelengths of optical signals to be multiplexed, this results in a large number of the spare light sources, thereby causing increase in cost for maintenance of these light sources. Accordingly, in order to reduce that cost, a wavelength-variable light source is required which can output laser light having multiple wavelengths by using one optical semiconductor device. According to the optical semi-conductor device 1 of Embodiment 1, although the plural semiconductor lasers 2 are mounted therein, it is possible to ensure isolation between the anode electrode 23 of each of the plural semiconductor lasers 2 and the anode electrode 22 of each of the light detectors 9, and at the same time, it is possible to suppress increase in the chip length of the optical semiconductor device 1 in the longitudinal direction. Therefore, according to the optical semiconductor device 1 of Embodiment 1, it is possible to achieve a wavelength-variable light source including spare semiconductor lasers 2, while suppressing increase in the chip length in the longitudinal direction. In the case where sixteen semiconductor lasers 2 are mounted in the optical semiconductor device 1, they may be mounted as two sets of semiconductor laser groups each capable of outputting laser light of eight types of wavelengths. Further, in the case where sixteen semiconductor lasers 2 are mounted in the optical semiconductor device 1, they may be mounted as four sets of semiconductor laser groups each capable of outputting laser light of four types of wavelengths.

According to the optical semiconductor device 1 of Embodiment 1, because the reflected light 11 produced at the rear-end face 12 from the second output light 10 outputted from the third waveguide 8, is absorbed by the light detector 9, and thus return light toward the semiconductor laser 2 is reduced, it is possible to suppress increase in the spectral linewidth. According to the optical semiconductor device 1 of Embodiment 1, when the waveguide width of the third waveguide 8 on the rear-end face 12-side is set to 3 μm or more, it is possible to suppress spreading of the beam of the second output light 10 to be outputted from the third waveguide 8. This makes it possible to further reduce return light toward the semiconductor laser 2, to thereby further suppress increase in the spectral linewidth. Further, according to the optical semiconductor device 1 of Embodiment 1, the light detectors 9 are each located on the light path of the reflected light 11 produced at the rear-end face 12 from the second output light 10 outputted from the third waveguide 8. Thus, as compared with a case where, like in Patent Document 1, the semiconductor laser 2 and the light detector 9 are arranged in series with each other in the longitudinal direction of the chip, it is possible to ensure isolation between the anode electrode 23 of the semiconductor laser 2 and the anode electrode 22 of the light detector 9, without increasing the chip length in the longitudinal direction.

It is noted that, in FIG. 1, the optical semiconductor device 1 is exemplified as including the optical amplifier 6; however, it may not have the optical amplifier 6.

As described above, the optical semiconductor device 1 of Embodiment 1 is an optical semiconductor device which comprises the plural semiconductor lasers 2, the plural light detectors 9, plural waveguides (third waveguides 8) and the optical multiplexer circuit 4 that are formed on the semiconductor substrate 15, said plural semiconductor lasers 2 each serving to output first light from the front-end side thereof and also to output second light from the rear-end side thereof that is a side opposite to the front-end side;

said optical multiplexer circuit 4 serving to multiplex respective rays of the first light outputted from the plural semiconductor lasers 2, to thereby send out output light (first output light 7);

said plural waveguides (third waveguides 8) serving to guide respective rays of the second light toward one end face (rear-end face 12) of the optical semiconductor device 1; and said plural light detectors 9 serving to receive respective rays of reflected light 11 that are due to reflection of the respective rays of the second light after being guided by the waveguides (third waveguides 8), on the one end face (rear-end face 12).

The light detectors 9 are each located between the rear-end side of the semiconductor laser 2 and the one end face (rear-end face 12), and the second light (second output light 10) to be outputted from each of the waveguides (third waveguides 8) is outputted diagonally relative to the perpendicular line 27 with respect to the one end face (rear-end face 12). According to this configuration, in the optical semiconductor device 1 of Embodiment 1, for each of the semiconductor lasers 2, the light detector 9 is provided that receives the reflected light 11 due to reflection of the second light outputted from the rear-end side of each of the semiconductor lasers 2, on the one end face (rear-end face 12). Thus, it is possible to reduce return light toward the semiconductor laser 2, that is due to reflection on a rear-side end face (rear-end face 12), to thereby suppress increase in the spectral linewidth of the first output light 7 for optical communication.

Embodiment 2

Figure 9:
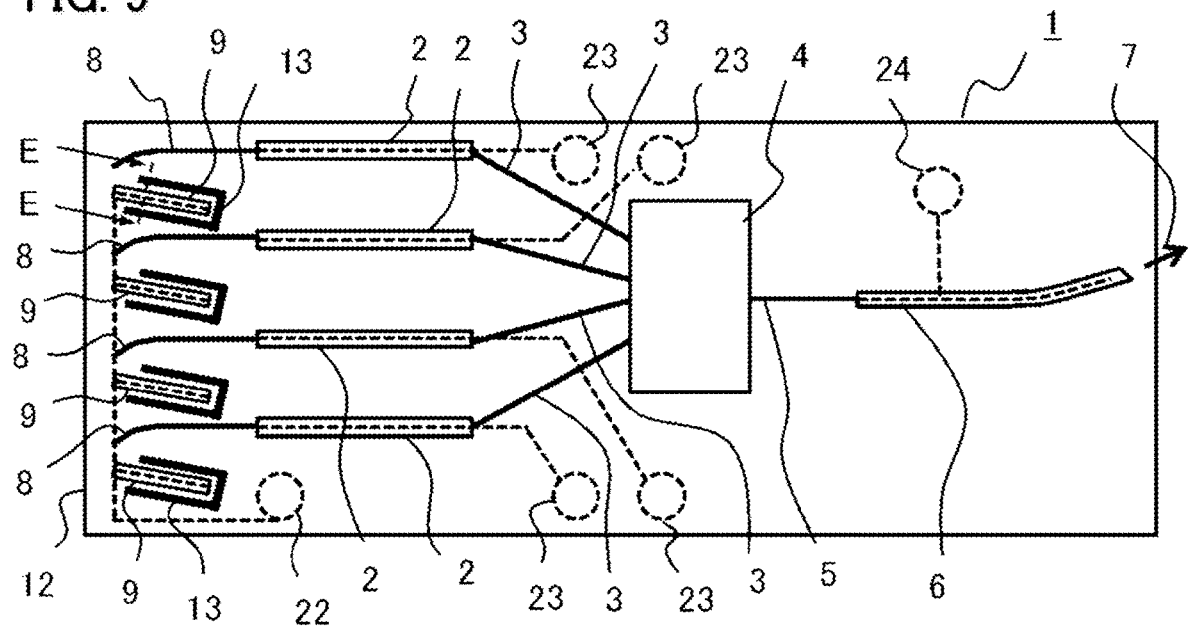
FIG. 9 is a diagram showing an optical semiconductor device according to Embodiment 2.
Figure 10:
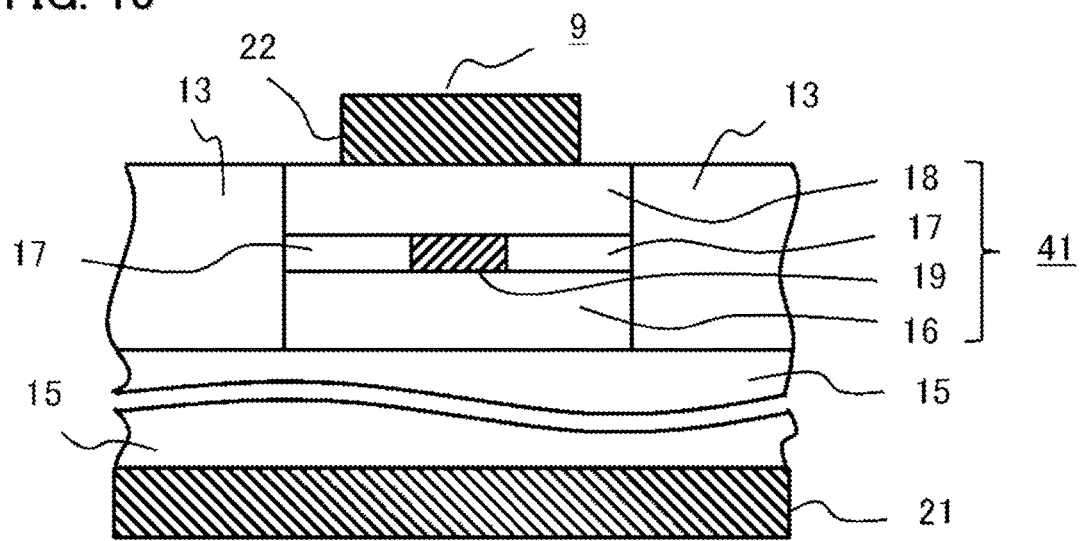
FIG. 10 is a sectional view along E-E in FIG. 9.

FIG. 9 is a diagram showing an optical semiconductor device according to Embodiment 2, and FIG. 10 is a sectional view along E-E in FIG. 9. The optical semiconductor device 1 of Embodiment 2 differs from the optical semiconductor device 1 of Embodiment 1 in that mesa grooves 13 are each formed around sides of the light detector 9 in three directions. Description will be made mainly on portions different from the optical semiconductor device 1 of Embodiment 1. The mesa groove 13 is not formed on the incident side of the reflected light 11, namely, the rear-end face 12-side. According to the optical semiconductor device 1 of Embodiment 2, since the mesa groove 13 is formed so as to partition the semiconductor laser 2 and the light detector 9 from each other, it is allowed to decrease a distance between the locations of the semiconductor device 2 and the light detector 9 with respect to the longitudinal direction of the optical semiconductor device 1, while ensuring sufficient isolation between the anode electrode 23 of the semiconductor laser 2 and the anode electrode 22 of the light detector 9. Accordingly, the optical semiconductor device 1 of Embodiment 2 can make the chip length in the longitudinal direction smaller than that of the optical semiconductor device 1 of Embodiment 1. In FIG. 9, a case is shown where the mesa groove 13 is formed between the light detector 9 and the semiconductor laser 2 that outputs the second light (light outputted from the rear-end side) to be received by that light detector 9, and where the mesa groove 13 is formed nearer to the light detector 9 than to the semiconductor laser 2.

According to the optical semiconductor device 1 of Embodiment 2, the reflected light 11 produced at the rear-end face 12 from the second output light 10 outputted from the third waveguide 8, may be reflected by the mesa groove 13. Because a portion of the reflected light 11 not incident on the light detector 9 will be reflected by the mesa groove 13 and thus a majority of the reflected light 11 can be absorbed by the light detector 9, the optical semiconductor device 1 of Embodiment 2 can reduce return light toward the semiconductor laser 2 to thereby suppress increase in the spectral linewidth, more significantly than the optical semiconductor device 1 of Embodiment 1.

As shown in FIG. 9, the anode electrode 22 of the light detector 9 extends in the longitudinal direction of the light detector 9, and the anode electrodes 22 of the plural light detectors 9 are mutually connected on the rear-end face 12-side in a manner bypassing the mesa grooves 13. An external connection portion for the anode electrodes 22 of the light detectors 9, that is a portion to be connected to an outside (a portion in a broken-line circle), is located, for example, on the other end side of the optical semiconductor device 1 in the transverse direction.

Other than the mesa grooves 13 and the layout of the anode electrodes 22 of the light detectors 9, the optical semiconductor device 1 of Embodiment 2 has a structure that is the same as that of the optical semiconductor device 1 of Embodiment 1, and thus achieves the same effect as that according to the optical semiconductor device 1 of Embodiment 1. Further, according to the structure of the optical semiconductor device 1 of Embodiment 2, because of the mesa groove 13, it is possible to reduce return light that is caused by the reflected light 11 produced at the rear-end face 12 from the second output light 10 outputted from the third waveguide 8. This makes it possible to suppress increase in the spectral linewidth, more significantly than the optical semiconductor device 1 of Embodiment 1. Namely, the optical semiconductor device 1 of Embodiment 2 can narrow the spectral linewidth of the first output light 7, more significantly than the optical semiconductor device 1 of Embodiment 1. Further, the optical semiconductor device 1 of Embodiment 2 can make the chip length in the longitudinal direction smaller than that of the optical semiconductor device 1 of Embodiment 1, while ensuring sufficient isolation between the anode electrode 23 of the semiconductor laser 2 and the anode electrode 22 of the light detector 9.

In FIG. 9, a case is shown where the mesa grooves 13 are each formed around the sides of the light detector 9 in three directions. Namely, this is the case where the mesa groove 13 is formed so as to surround both long sides of the light detector 9 and one of short sides thereof being located farther from the rear-end face 12 as the one end face. However, the arranged structure of the mesa groove 13 is not limited thereto. In general, in a wavelength-variable light source including plural semi-conductor lasers 2, only a given one of the semiconductor laser 2 outputs laser light. Thus, it suffices to reduce light as reflected light 11 due to reflection on the rear-end face 12, that intrudes into said semiconductor laser 2 outputting the laser light. Accordingly, the mesa groove 13 may not be located on a face side away from the semiconductor laser 2. Namely, the mesa groove 13 may be formed so as to surround one of the long sides of the light detector 9 being located nearer to the semiconductor laser 2 that outputs the second light to be received by that light detector 9, and one of the short sides being located farther from the rear-end face 12 as the one end face.

Embodiment 3

Figure 11:
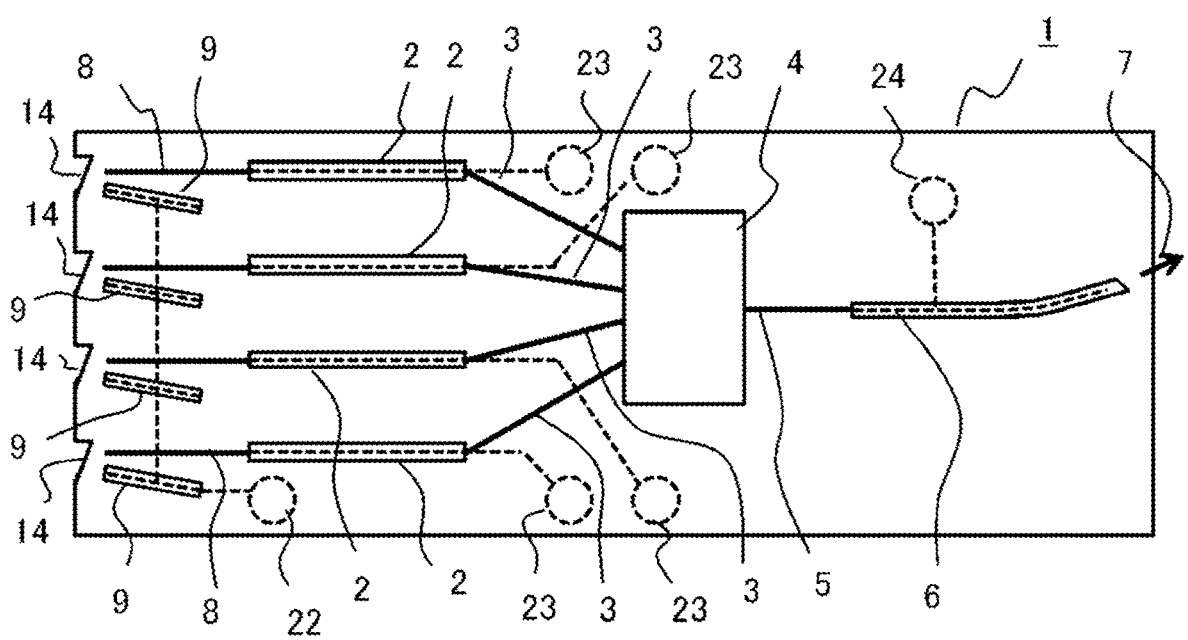
FIG. 11 is a diagram showing an optical semiconductor device according to Embodiment 3.
Figure 12:
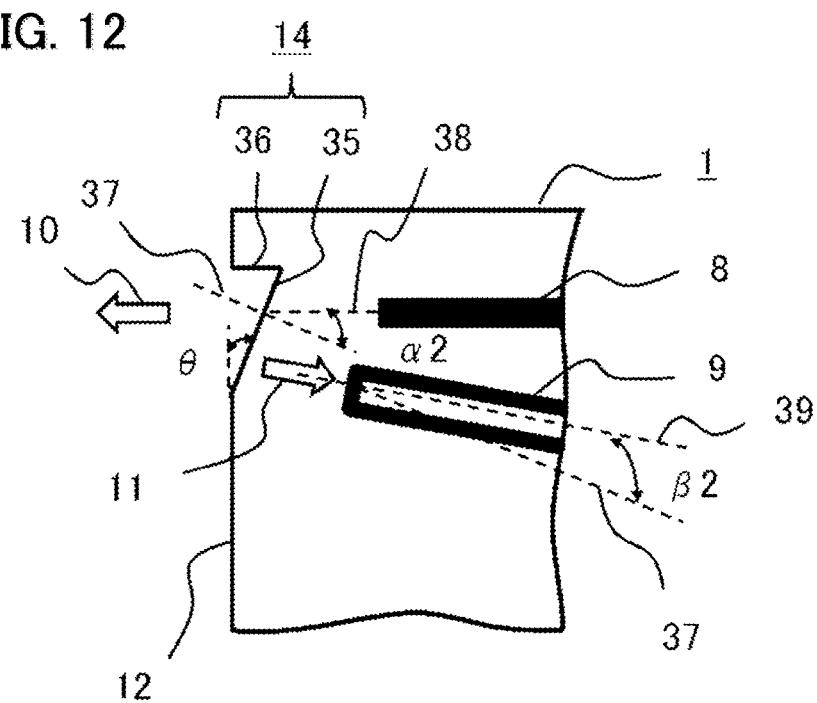
FIG. 12 is an enlarged view of rear-end face side portions of a first example of a third waveguide and a light detector in FIG. 11.
Figure 13:
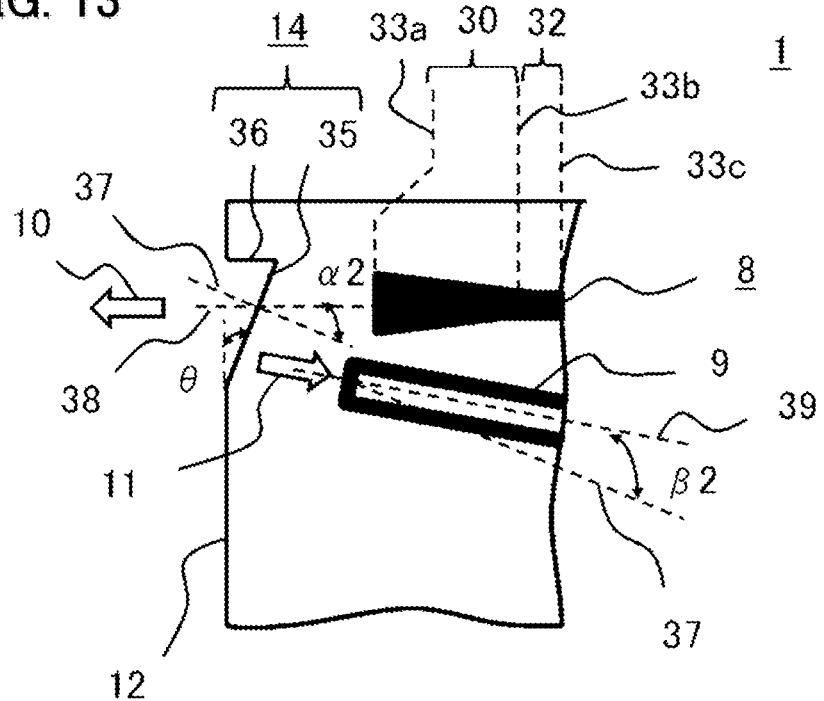
FIG. 13 is a diagram showing a second example of the third waveguide in FIG. 11.
Figure 14:
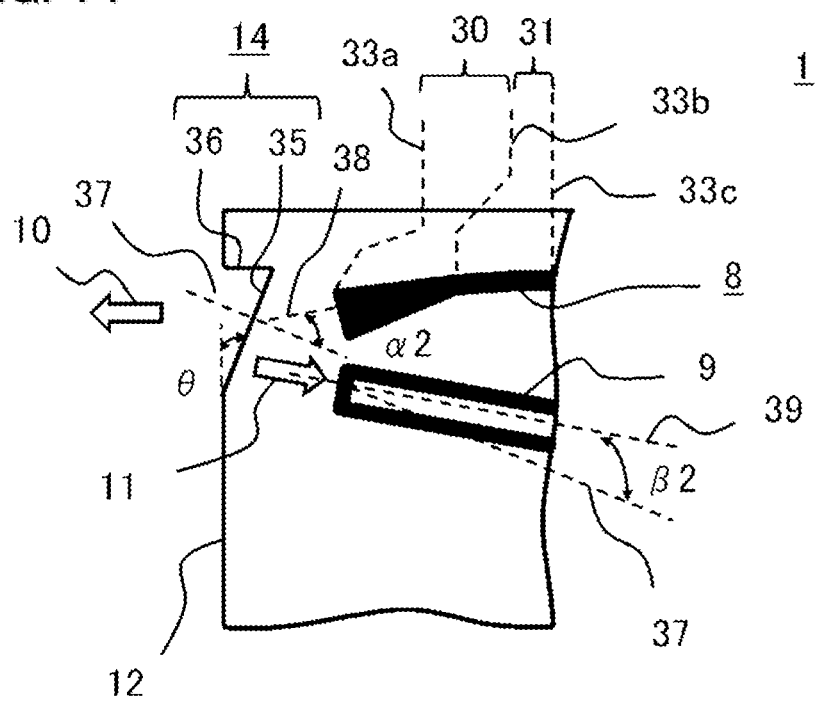
FIG. 14 is a diagram showing a third example of the third waveguide in
FIG. 11.
Figure 15:
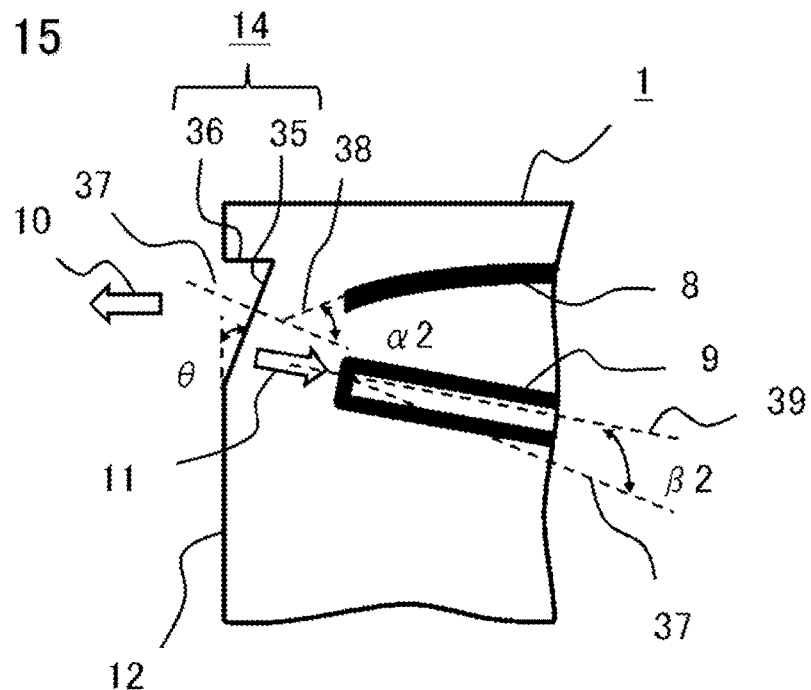
FIG. 15 is a diagram showing a fourth example of the third waveguide in FIG. 11.

FIG. 11 is a diagram showing an optical semiconductor device according to Embodiment 3. FIG. 12 is an enlarged view of rear-end face side portions of a first example of a third waveguide and a light detector in FIG. 11. FIG. 13, FIG. 14 and FIG. 15 are diagrams showing a second example, a third example and a fourth example of the third waveguide in FIG. 11, respectively. An optical semiconductor device 1 of Embodiment 3 differs from the optical semiconductor device 1 of Embodiment 1 in that plural concave portions 14 are formed on the rear-end face 12. Description will be made mainly on portions different from the optical semiconductor device 1 of Embodiment 1. The concave portions 14 are formed by dry etching. The concave portion 14 has an inclined end face 35 and a concave-portion side face 36. The inclined end face 35 is formed to incline by an inclination angle $\theta$ relative to the rear-end face 12. When the third waveguide 8 and the inclined end face 35 are formed so that the second output light 10 of the third waveguide is outputted diagonally relative to a perpendicular line 37 with respect to the inclined end face 35, out of the reflected light 11 due to reflection on the inclined end face 35, light that is incident on the third waveguide 8 and guided toward the semiconductor laser 2, namely, return light, is reduced. The inclination angle $\theta$ is selected according to an angle $\alpha 2$ and a shape of the third waveguide 8, to be described below.

It is preferable that the second output light 10 of the third waveguide 8 be outputted at an angle of 7° or more relative to the perpendicular line 37 with respect to the inclined end face 35. Namely, it is preferable that the angle $\alpha 2$ shown in FIG. 12 between a broken line 38 that is parallel to the traveling direction of the second output light 10 and the perpendicular line 37, be 7° or more. Meanwhile, the light detector 9 is located to extend in a traveling direction of the reflected light 11 due to reflection on the inclined end face 35. Namely, the light detector 9 is located to extend on a broken line 39 indicative of the traveling direction of the reflected light 11. As an angle β2 between the broken line 39 and the perpendicular line 37, an optimal angle is selected according to the angle α2. At the angle β2, the light detector 9 is located to extend on the broken line 39 indicative of the traveling direction of the reflected light 11, so that it can absorb the reflected light 11 most efficiently. However, with respect to the angle β2, the light detector may be deviated from the broken line 39 indicative of the traveling direction of the reflected light 11. When the angle β2 is set smaller than the angle α2, it is possible to decrease the width of the optical semiconductor device 1 in the transverse direction, namely, the width in the array direction of the semiconductor lasers 2 and the light detectors 9. Note that, when the spread of the second output light 10 is small, the output angle α2 at which the light is outputted toward the inclined end face 35 is the same as the reflection angle of the reflected light 11 (the angle between the traveling direction at which the intensity is maximum and the perpendicular line 37). In FIG. 12, a case is shown where, in terms of decreasing the width of the optical semiconductor device 1 in the transverse direction, the arrangement angle β2 of the light detector 9 is set smaller than the output angle α2.

Other than that the plural concave portions 14 are formed on the rear-end face 12, the optical semiconductor device 1 of Embodiment 3 has a structure that is the same as that of the optical semiconductor device 1 of Embodiment 1, and thus achieves the same effect as that according to the optical semiconductor device 1 of Embodiment 1.

It is preferable that the waveguide width at the output end of the third waveguide 8, namely, its waveguide width on the rear-end face 12-side, be 3 μm or more. It is more preferable that the waveguide width at the output end of the third waveguide 8 be 4 μm or more. This suppresses spreading of the beam of the second output light 10 to be outputted from the third waveguide 8, to thereby reduce return light toward the semiconductor laser 2.

The third waveguide 8 is not limited to the linear waveguide shown in FIG. 12. In FIG. 13, the third waveguide 8 is exemplified by a tapered linear waveguide. In FIG. 14, the third waveguide 8 is exemplified by a tapered and curved waveguide, and in FIG. 15, the third waveguide 8 is exemplified by a curved waveguide. The third waveguide 8 may be configured as a linear waveguide, a tapered linear waveguide, a tapered and curved waveguide or a curved waveguide, or any combination thereof. The third waveguide 8 shown in FIG. 13 has a tapered portion 30 and a linear portion 32. A portion from a broken line 33a to a broken line 33b in FIG. 13 is the tapered portion 30, and a portion from the broken line 33b to a broken line 33c in FIG. 13 is the linear portion 32. The third waveguide 8 shown in FIG. 14 has a tapered portion 30 and a curved portion 31. A portion from a broken line 33a to a broken line 33b in FIG. 14 is the tapered portion 30, and a portion from the broken line 33b to a broken line 33c in FIG. 14 is the curved portion 31.

According to the optical semiconductor device 1 of Embodiment 3, when the concave portions 14 are formed on the rear-end face 12 so that the second output light 10 to be outputted from each of the third waveguides 8 is outputted at an angle of 7° or more relative to the perpendicular line 37 with respect to the inclined end face 35, it is possible to reduce return light from the reflected light 11 due to reflection on the inclined end face 35, that is incident on the third waveguide 8 and guided toward the semiconductor laser 2. According to the optical semiconductor device 1 of Embodiment 3, because the return light from the reflected light 11 due to reflection on the inclined end face 35, that goes back to the semiconductor laser 2 from the third waveguide 8, can be reduced, it is possible to suppress increase in the spectral linewidth of the first output light 7 to be used for optical communication. Further, according to the optical semiconductor device 1 of Embodiment 3, when the third waveguide 8 is provided as a tapered waveguide, or when the waveguide width at the output end of the third waveguide 8, namely, its waveguide width on the rear-end face 12-side, is set to 3 μm or more, it is possible to suppress spreading of the beam of the second output light 10 to be outputted from the third waveguide 8. This further reduces the return light toward the semiconductor laser 2, thus making it possible to further suppress increase in the spectral linewidth of the first output light 7 to be used for optical communication.

According to the optical semiconductor device 1 of Embodiment 3, when the concave portions 14 are formed on the rear-end face 12 so that the second output light 10 to be outputted from each of the third waveguides 8 is outputted at an angle of 7° or more relative to the perpendicular line 37 with respect to the inclined end face 35, it is possible to achieve the same effect as that according to the optical semi-conductor device 1 of Embodiment 1, and also to make the width in the transverse direction, namely, the width in the array direction of the semiconductor lasers 2 and the light detectors 9, smaller than that of the optical semiconductor device 1 of Embodiment 1. According to the optical semiconductor device 1 of Embodiment 3, when the third waveguide 8 is provided as a linear waveguide or a tapered waveguide as shown in FIG. 12 or FIG. 13, it is possible to make the width in the transverse direction smaller than that of the optical semiconductor device 1 provided with the third wavelength 8 of another shape.

As described above, the optical semiconductor device 1 of Embodiment 3 is an optical semiconductor device which comprises the plural semiconductor lasers 2, the plural light detectors 9, plural waveguides (third waveguides 8) and the optical multiplexer circuit 4 that are formed on the semiconductor substrate 15, said plural semiconductor lasers 2 each serving to output first light from the front-end side thereof and also to output second light from the rear-end side thereof that is a side opposite to the front-end side;

said optical multiplexer circuit 4 serving to multiplex respective rays of the first light outputted from the plural semiconductor lasers 2, to thereby send out output light (first output light 7);

said plural waveguides (third waveguides 8) serving to guide respective rays of the second light toward one end face (rear-end face 12) of the optical semiconductor device 1; and said plural light detectors 9 serving to receive respective rays of the reflected light 11 that are due to reflection of the respective rays of the second light after being guided by the waveguides (third waveguides 8), on the respective inclined end faces 35 in the plural concave portions 14 formed on the one end face (rear-end face 12).

The light detectors 9 are each located between the rear-end side of the semiconductor laser 2 and the inclined end face 35, and the second light (second output light 10) to be outputted from each of the waveguides (third waveguides 8) is outputted diagonally relative to the perpendicular line 37 with respect to the inclined end face 35. According to this configuration, in the optical semiconductor device 1 of Embodiment 3, for each of the semiconductor lasers 2, the light detector 9 is provided that receives the reflected light 11 due to reflection of the second light outputted from the rear-end side of each of the semiconductor lasers 2, on the inclined end face 35 in each of the concave portions 14 formed on the one end face (rear-end face 12). Thus, it is possible to reduce return light toward the semiconductor laser 2, that is due to reflection on a rear-side end face (inclined end face 35), to thereby suppress increase in the spectral linewidth of the first output light 7 for optical communication.

Embodiment 4

Figure 16:
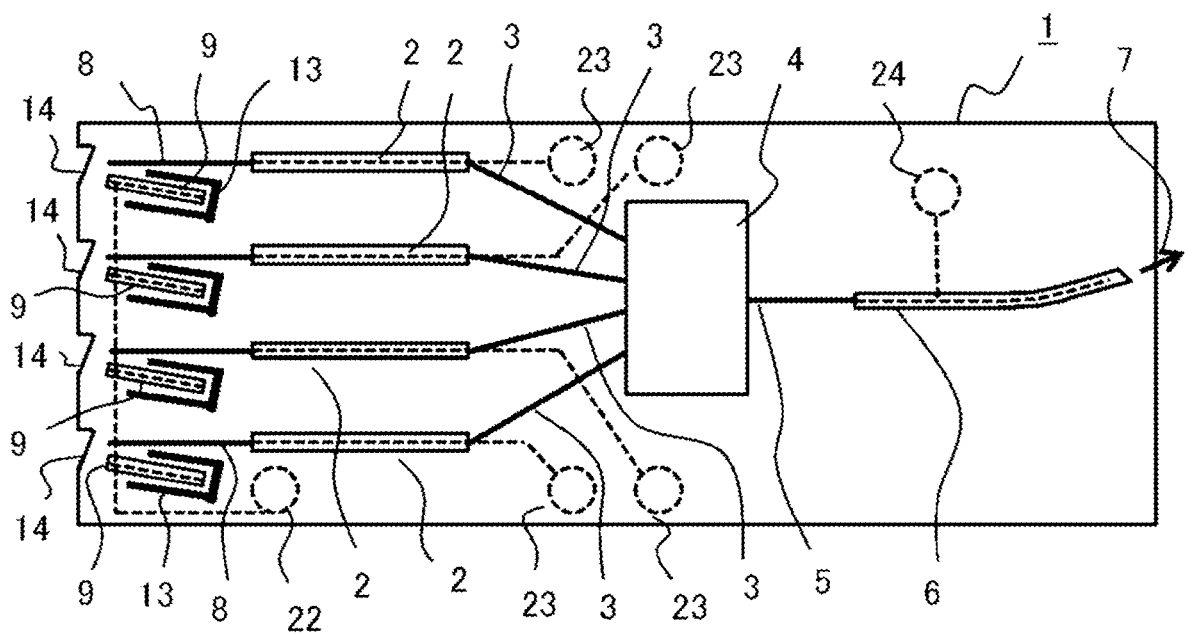
FIG. 16 a diagram showing an optical semiconductor device according to Embodiment 4.

FIG. 16 is a diagram showing an optical semi-conductor device according to Embodiment 4. The optical semiconductor device 1 of Embodiment 4 differs from the optical semiconductor device 1 of Embodiment 3 in that mesa grooves 13 are each formed around sides of the light detector 9 in three directions. The optical semiconductor device 1 of Embodiment 4 has a combined configuration corresponding both to the optical semiconductor device 1 of Embodiment 3 and the optical semiconductor device 1 of Embodiment 2. Thus, the optical semiconductor device 1 of Embodiment 4 can achieve the effect according to the optical semiconductor device 1 of Embodiment 3 and the effect according to the optical semiconductor device 1 of Embodiment 2.

It is noted that, in Embodiment 1 to 4, such cases have been described where, in the optical semi-conductor device 1, the respective plural numbers of semiconductor lasers 2, first waveguides 3, third waveguides 8 and light detectors 9 are mounted, and the optical multiplexer circuit 4, the second waveguide 5 and the optical amplifier 6 are each mounted singly. However, an arranged structure of the semiconductor laser 2, the third waveguide 8 and the light detector 9 may be applied to an optical semiconductor device of another type. Namely, the arranged structure of the semiconductor laser 2, the third waveguide 8 and the light detector 9 shown in each of Embodiments 1 to 4, may be employed in an optical semiconductor device 1 which comprises: a single set of semiconductor laser 2, third waveguide 8 and light detector 9; another waveguide for guiding the first output light of the semiconductor laser 2 toward the opposite side to the third wavelength 8; and an optical amplifier 6 connected to the other waveguide. Note that the other waveguide is a linear waveguide corresponding to the second waveguide 5. Further, the optical amplifier 6 may be eliminated. In this case, similar to the optical amplifier 6, the other waveguide may be a waveguide that includes a curved portion 31 and a linear portion 32 shown, for example, in FIG. 7. Such an optical semiconductor device 1 comprising a single set of semiconductor laser 2, third waveguide 8 and light detector 9 can reduce, like the optical semiconductor device 1 of each of Embodiments 1 to 4, return light toward the semiconductor laser 2 that is due to reflection on a rear-side end face as the rear-end face 12 or the inclined end face 35, to thereby suppress increase in the spectral linewidth of the first output light 7 for optical communication.

It should be noted that, in this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where at least one configuration element is added or omitted; and furthermore, where at least one configuration element is extracted and combined with a configuration element of another embodiment.

DESCRIPTION OF REFERENCE NUMERALS AND SIGNS

1: optical semiconductor device, 2: semiconductor laser, 4: optical multiplexer circuit, 6: optical amplifier, 7: first output light, 8: third waveguide, 9: light detector, 10: second output light, 11: reflected light, 12: rear-end face (one end face), 13: mesa groove, 14: concave portion, 15: semiconductor substrate, 16: first cladding layer, 17: current blocking layer, 18: second cladding layer, 19: light absorption layer, 20: active layer, 21: cathode electrode, 22: anode electrode, 23: anode electrode, 27: perpendicular line, 30: tapered portion, 35: inclined end face, 37: perpendicular line.

The invention claimed is:

1. An optical semiconductor device which comprises plural semiconductor lasers, plural light detectors, plural waveguides and an optical multiplexer circuit that are formed on a semiconductor substrate,
   said plural semiconductor lasers each serving to output first light from a front-end side thereof and also to output second light from a rear-end side thereof that is a side opposite to the front-end side;
   said optical multiplexer circuit serving to multiplex respective rays of the first light outputted from the plural semiconductor lasers, to thereby send out output light;
   said plural waveguides serving to guide respective rays of the second light toward one end face of the optical semiconductor device; and
   said plural light detectors serving to receive respective rays of reflected light that are due to reflection of the respective rays of the second light after being guided by the waveguides, on the one end face or on respective inclined end faces in plural concave portions formed on the one end face;
   wherein the light detectors are each located between the rear-end side of each of the semiconductor lasers and the one end face or each of the inclined end faces; and
   wherein the second light to be outputted from each of the waveguides is outputted diagonally relative to a perpendicular line with respect to the one end face or the inclined end face.

2. The optical semiconductor device of claim 1, further comprising mesa grooves each provided between the light detector and the semiconductor laser that outputs the second light to be received by that light detector.

3. The optical semiconductor device of claim 2, wherein the mesa groove is formed nearer to the light detector than to the semiconductor laser.

4. The optical semiconductor device of claim 3, wherein the light detector extends in a manner inclined relative to an extending direction of the semiconductor laser.

5. The optical semiconductor device of claim 3, further comprising an optical amplifier for amplifying the output light sent out from the optical multiplexer circuit.

6. The optical semiconductor device of claim 3, wherein the waveguide has, in its end region located on a side where the second light is outputted, a tapered portion that becomes wider in a traveling direction of that light.

7. The optical semiconductor device of claim 3, wherein the light detector comprises:

a first cladding layer formed on a front surface of the semiconductor substrate;
a light absorption layer formed on a front surface of the first cladding layer;
current blocking layers each formed on a front surface of the first cladding layer and connected to each of side surfaces of the light absorption layer;
a second cladding layer formed on front surfaces of the light absorption layer and the current blocking layers;
an anode electrode formed on a front-surface side of the second cladding layer; and
a cathode electrode formed on a back surface of the semiconductor substrate.

8. The optical semiconductor device of claim 2, wherein the light detector extends in a manner inclined relative to an extending direction of the semiconductor laser.

9. The optical semiconductor device of claim 2, further comprising an optical amplifier for amplifying the output light sent out from the optical multiplexer circuit.

10. The optical semiconductor device of claim 2, wherein the waveguide has, in its end region located on a side where the second light is outputted, a tapered portion that becomes wider in a traveling direction of that light.

11. The optical semiconductor device of claim 2, wherein the light detector comprises:
a first cladding layer formed on a front surface of the semiconductor substrate;
a light absorption layer formed on a front surface of the first cladding layer;
current blocking layers each formed on a front surface of the first cladding layer and connected to each of side surfaces of the light absorption layer;
a second cladding layer formed on front surfaces of the light absorption layer and the current blocking layers;
an anode electrode formed on a front-surface side of the second cladding layer; and
a cathode electrode formed on a back surface of the semiconductor substrate.

12. The optical semiconductor device of claim 1, wherein the light detector extends in a manner inclined relative to an extending direction of the semiconductor laser.

13. The optical semiconductor device of claim 1, wherein the light detector extends in a manner inclined relative to an extending direction of the semiconductor laser, and
wherein mesa grooves are provided each being formed so as to surround one of long sides of the light detector being located nearer to the semiconductor laser that outputs the second light to be received by that light detector, and one of short sides thereof being located farther from the one end face or the inclined end face.

14. The optical semiconductor device of claim 1, wherein the light detector extends in a manner inclined relative to an extending direction of the semiconductor laser, and
wherein mesa grooves are provided each being formed so as to surround both long sides of the light detector and one of short sides thereof being located farther from the one end face or the inclined end face.

15. The optical semiconductor device of claim 1, further comprising an optical amplifier for amplifying the output light sent out from the optical multiplexer circuit.

16. The optical semiconductor device of claim 1, wherein the waveguide has, in its end region located on a side where the second light is outputted, a tapered portion that becomes wider in a traveling direction of that light.

17. The optical semiconductor device of claim 1, wherein the light detector comprises:
a first cladding layer formed on a front surface of the semiconductor substrate;
a light absorption layer formed on a front surface of the first cladding layer;
current blocking layers each formed on a front surface of the first cladding layer and connected to each of side surfaces of the light absorption layer;
a second cladding layer formed on front surfaces of the light absorption layer and the current blocking layers;
an anode electrode formed on a front-surface side of the second cladding layer; and
a cathode electrode formed on a back surface of the semiconductor substrate.

18. The optical semiconductor device of claim 17, wherein the semiconductor laser comprises:
a first cladding layer formed on a front surface of the semiconductor substrate;
an active layer formed on a front surface of the first cladding layer;
current blocking layers each formed on a front surface of the first cladding layer and connected to each of side surfaces of the active layer;
a second cladding layer formed on front surfaces of the active layer and the current blocking layers;
an anode electrode formed on a front-surface side of the second cladding layer; and
a cathode electrode formed on a back surface of the semiconductor substrate,
wherein the active layer and the light absorption layer of the light detector are formed on the front surfaces of the first cladding layers that are provided as a common layer.

19. The optical semiconductor device of claim 18, wherein the anode electrodes of the plural light detectors are connected to each other.

20. The optical semiconductor device of claim 17, wherein the anode electrodes of the plural light detectors are connected to each other.

21. The optical semiconductor device of claim 1, wherein each of the light detectors is offset from an axis of the semiconductor laser in an extending direction of the semiconductor laser toward the light detector.

* * * * *